United States Patent
Hong et al.

(10) Patent No.: US 9,548,314 B1
(45) Date of Patent: Jan. 17, 2017

(54) METHOD OF MAKING A NON-VOLATILE MEMORY (NVM) WITH TRAP-UP REDUCTION

(71) Applicant: FREESCALE SEMICONDUCTOR, INC., Austin, TX (US)

(72) Inventors: Cheong Min Hong, Austin, TX (US); Konstantin V. Loiko, Austin, TX (US); Juanyi Yin, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/945,981

(22) Filed: Nov. 19, 2015

(51) Int. Cl.
*H01L 21/8234* (2006.01)
*H01L 27/115* (2006.01)
*H01L 29/423* (2006.01)
*H01L 21/28* (2006.01)

(52) U.S. Cl.
CPC ... *H01L 27/11568* (2013.01); *H01L 21/28282* (2013.01); *H01L 27/11573* (2013.01); *H01L 29/42344* (2013.01); *H01L 29/42348* (2013.01)

(58) Field of Classification Search
CPC .............. H01L 21/28282; H01L 27/11568
See application file for complete search history.

(56) References Cited

U.S. PATENT DOCUMENTS

| 6,232,185 | B1 | 5/2001 | Wang |
| 7,645,656 | B2 | 1/2010 | Chen et al. |
| 8,106,466 | B2* | 1/2012 | Cheng .............. H01L 21/82380 257/288 |
| 8,372,706 | B2 | 2/2013 | Liao et al. |
| 8,754,464 | B2 | 6/2014 | Sim |
| 8,937,369 | B2* | 1/2015 | Liu .................. H01L 21/82380 257/632 |
| 9,171,928 | B2* | 10/2015 | Ogata ................ H01L 29/6656 |
| 9,275,864 | B2* | 3/2016 | Perera .............. H01L 21/28273 |

* cited by examiner

*Primary Examiner* — Bradley K Smith

(57) ABSTRACT

A method for forming a semiconductor device includes forming a select gate over a substrate and forming a charge storage layer and a control gate over the select gate. The charge storage layer and control gate overlap a first sidewall of the select gate and the charge storage layer is between the select gate and the control gate. A protective spacer is formed, wherein the protective spacer has a first portion adjacent a first sidewall of the charge storage layer and on the substrate, and the protective spacer is thinned. After thinning the protective spacer, a sidewall spacer is formed over the protective spacer, wherein the sidewall spacer has a first portion on the substrate, and the first portion of the protective spacer is between the first sidewall of the control gate and the first portion of the sidewall spacer.

20 Claims, 4 Drawing Sheets

METHOD OF MAKING A NON-VOLATILE MEMORY (NVM) WITH TRAP-UP REDUCTION

BACKGROUND

1. Field

This disclosure relates generally to semiconductor memory cells, and more particularly, to non-volatile memory (NVM) cells.

2. Related Art

Non-volatile memories (NVMs) have a limited endurance and efforts are continually being made to improve endurance. Improvements are being made in life-extending techniques using improved circuit design and in improved manufacturing techniques. One of the problems is what is known as trap-up in which charge becomes trapped in a dielectric and the charge is not readily moved by typical program and erase techniques. The result is that the threshold voltage for an erased device, which is the relatively high conductivity state, increases with the trap-up accumulation due to usage. The threshold voltage for a programmed device, which is the relatively low conductivity state, also increases with trap-up accumulation but much less than the increase in threshold for erased devices of the same usage. The result ultimately is that the high and low conductivity states become too close together for reliable detection, especially at higher speeds.

Accordingly there is a need to provide further improvement in reducing trap-up in NVMs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an NVM cell in an NVM region is made with a protection feature adjacent to the charge storage layer that protects the dielectric of the charge storage layer from damage during processing. The reduced damage results in reduced trap-up and thus longer life. This is better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
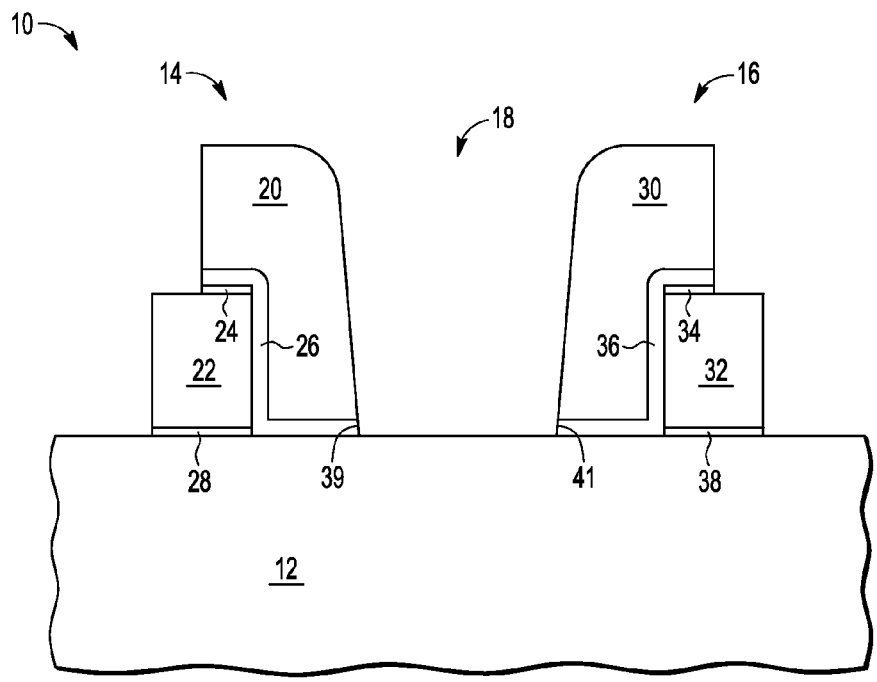
FIG. 1 is a cross section of a portion of a memory showing a cross section of two memory cells at a stage in processing.

Shown in FIG. 1 is a semiconductor device 10 having a substrate 12, a gate structure 14, a gate structure 16, an opening 18 between gate structures 14 and 16. Gate structure 14 has a control gate 20, a select gate 22, a dielectric layer 24 over a portion of select gate 22 and under an overhang portion of control gate 20, a charge storage layer 26 between select gate 22 and control gate 20 and between control gate 20 and substrate 12, and a gate dielectric 28 between select gate 22 and substrate 12. Gate structure 16 has a control gate 30, a select gate 32, a dielectric layer 34 over a portion of select gate 32 and under a overhang portion of control gate 30, a charge storage layer 36 between select gate 32 and control gate 30 and between control gate 30 and substrate 12, and a gate dielectric 38 between select gate 32 and substrate 12. In effect, charge storage layer 26 and control gate 20 that is over a portion of select gate 20 overlap a sidewall of select gate 22. Semiconductor device 10 also has a trap-up susceptible region 39 in charge storage layer 26 where charge storage layer 26 terminates at opening 18 and a trap-up susceptible region 41 where charge storage layer 36 terminates at opening 18. Control gates 20 and 30 and select gates 22 and 32 may be formed of polysilicon. Charge storage layers 26 and 36 may be formed of nanocrystals surrounded by oxide. Dielectric layers 24 and 34 may be formed of nitride and function as an anti-reflective coating (ARC). Gate dielectrics 28 and 38 may be grown oxide which also be called thermal oxide. Trap-up susceptible regions 39 and 41 are the edges representative of where etching and other processing typically occurred resulting in that edge having more damage. The increased damage had the effect of increasing the susceptibility to trap-up.

Figure 2:
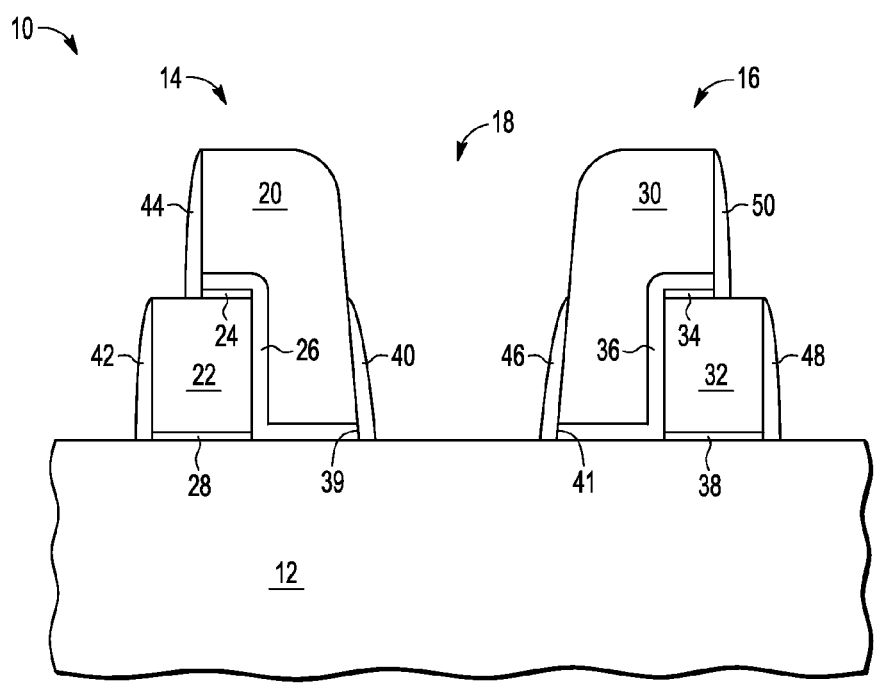
FIG. 2 is a cross section of the portion of the memory of FIG. 1 at a subsequent stage in processing.

Shown in FIG. 2 is semiconductor device 10 after forming a sidewall spacer 40 on control gate 20 in opening 18, a sidewall spacer 42 on a side of select gate 22 opposite sidewall spacer 40, and a sidewall spacer 44 on the side of the overhang of control gate 20 and after forming a sidewall spacer 46 on control gate 30 in opening 18, a sidewall spacer 48 on a side of select gate 32 opposite sidewall spacer 46, and a sidewall spacer 50 on the side of the overhang of control gate 30. Sidewall spacers 40, 42, and 44 are formed at the same time around gate structure 14 so that it may be that these sidewall spacers are interconnected so that these sidewall spacers 40, 42, and 44 may be referenced as portions of the same sidewall spacer. Similarly, sidewall spacers 46, 48, and 50 are formed at the same time around gate structure 14 so that it may be that these sidewall spacers are interconnected so that these sidewall spacers 46, 48, and 50 may be referenced as portions of the same sidewall spacer. Sidewall spacers 40, 42, 44, 46, 48, and 50 may be formed of oxide. They may also be formed of a different material such as nitride.

Figure 3:
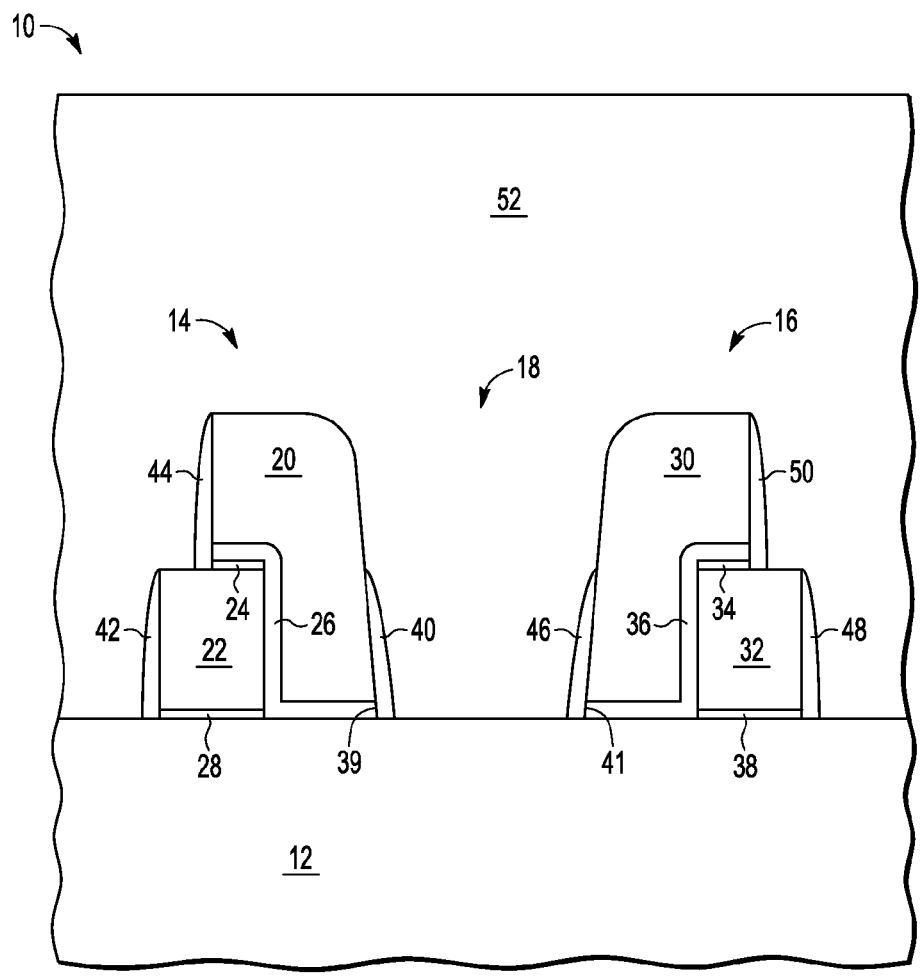
FIG. 3 is a cross section of the portion of the memory of FIG. 2 at a subsequent stage in processing.

Shown in FIG. 3 is semiconductor device 10 forming a photoresist layer 52 over semiconductor device 10 including over gate structures 14 and 16 and opening 18. Photoresist layer 52 protects the structures shown in FIG. 3 during etching performed elsewhere on the same integrated circuit. This etching may be of conductive material useful as logic gates.

Figure 4:
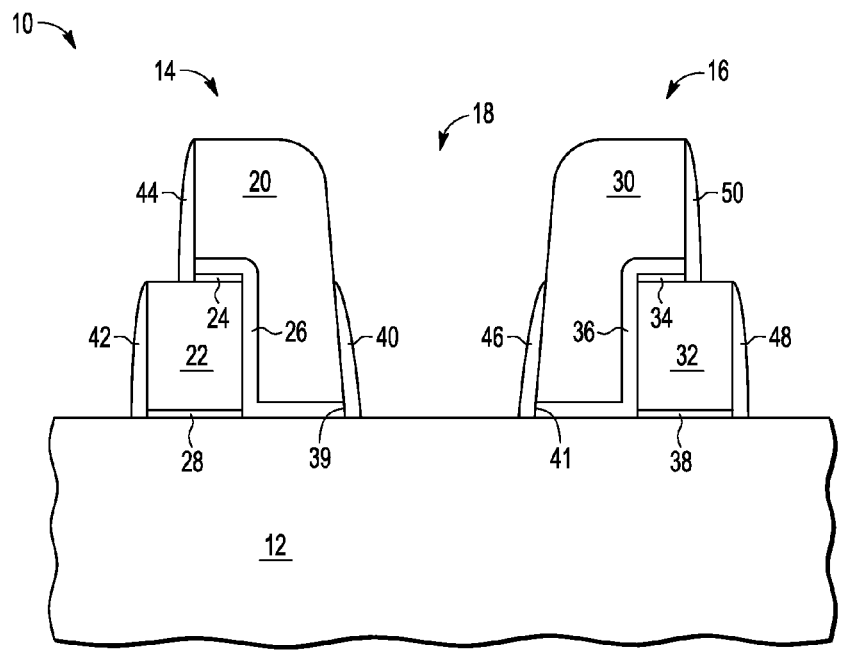
FIG. 4 is a cross section of the portion of the memory of FIG. 3 at a subsequent stage in processing.

Shown in FIG. 4 is semiconductor device 10 after removing photoresist 52. This removal process does provide some damage of oxide such as, potentially, the oxide that is part of charge storage layers 26 and 36, and in particular, trap-up susceptible regions 39 and 41, respectively. The damage, instead, is to the sidewall spacers. Sidewall spacers 40 and 46 are damaged and reduced in size while protecting trap-up susceptible regions 39 and 41, respectively. Sidewall spacers 42, 44, 48, and 50 are also damaged and reduced in size.

Figure 5:
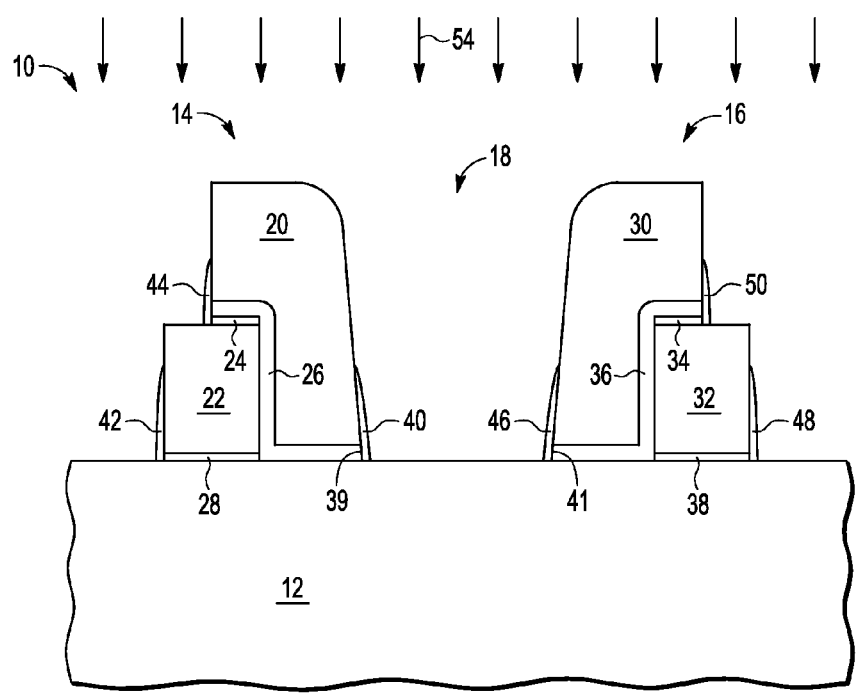
FIG. 5 is a cross section of the portion of the memory of FIG. 4 at a subsequent stage in processing.

Shown in FIG. 5 is semiconductor device 10 after performing an ash 54 which is typical for preparing a semiconductor device for further processing after removing photoresist. Ash 54 also results in damage to exposed oxide. Again, sidewall spacers 40 and 46, while themselves being damaged, protect trap-up susceptible regions 39 and 41, respectively. The thinning of sidewall spacers 40, 42, 44, 46, 48, and 50 can be measured experimentally and accordingly the amount of thinning can ultimately be selected based on those measurements. Sidewall spacers 40 and 46, in particular, may be referenced as protective spacers. A latter portion of the processing useful in the formation of logic gates may also occur during the processes described for FIGS. 4 and 5.

Figure 6:
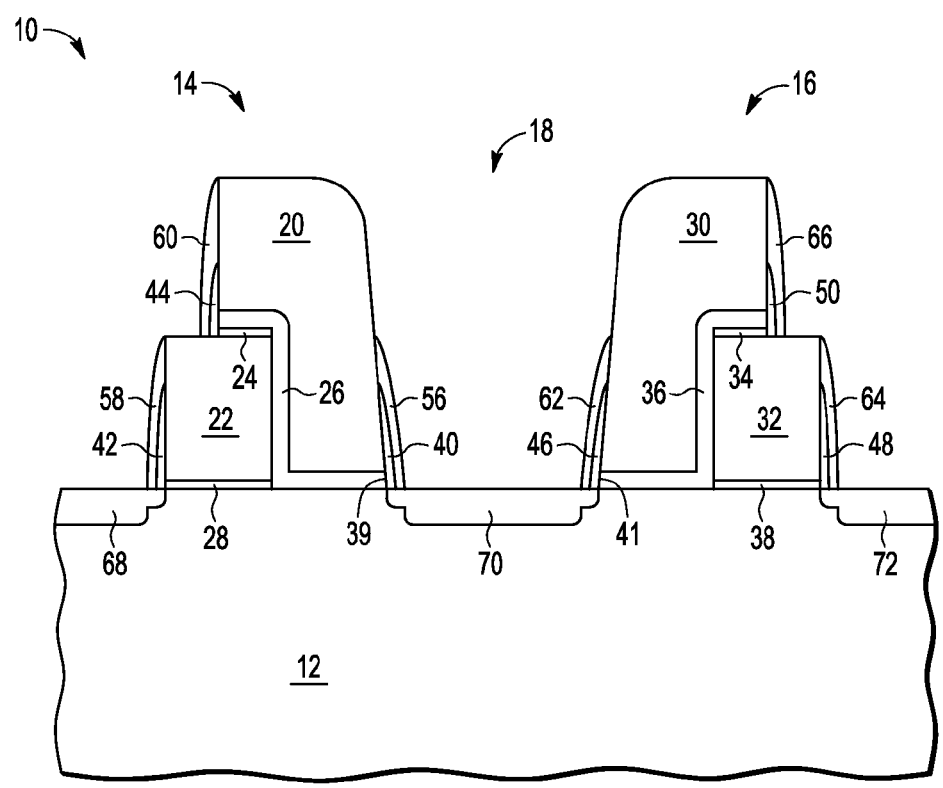
FIG. 6 is a cross section of a memory of the portion of the memory of FIG. 5 at a subsequent stage in processing.

Shown in FIG. 6 is semiconductor device 10 as a pair of NVM cells arising from forming sidewall spacers and doped regions. A sidewall spacer 56 is formed on sidewall spacer 40, a sidewall spacer 58 is formed on sidewall spacer 42, a sidewall spacer 60 is formed on sidewall spacer 44, a sidewall spacer 62 is formed on sidewall spacer 46, a sidewall spacer 64 is formed on sidewall spacer 48, and a sidewall spacer 66 is formed on sidewall spacer 50. A source/drain region 68, having an extension under sidewall spacers 58 and 42, is formed in substrate 12 adjacent to select gate 22. A source/drain region 70, having extensions under sidewall spacers 56 and 40 on one side and sidewall spacers 62 and 46 on the opposite side, is formed in substrate 12 in region 18. A source/drain region 72, having an extension under sidewall spacers 64 and 48, is formed in substrate 12 adjacent to select gate 32. All of the sidewall spacers are on substrate 12. The portion of substrate 12 shown in FIGS. 1-6 may be a well formed in substrate 12. Sidewall spacers 56, 58, 60, 62, 64, and 66 may be formed of oxide.

Thus it is seen that a charge storage layer can be protected during events that normally damage a charge storage layer and thereby reduce trap-up by reducing the damage in the trap-up susceptible region.

By now it should be appreciated that there has been provided a method for forming a semiconductor device including forming a select gate over a substrate. The method further includes forming a charge storage layer and a control gate over the select gate, wherein the charge storage layer and control gate overlap a first sidewall of the select gate and the charge storage layer is between the select gate and the control gate. The method further includes forming a protective spacer, wherein the protective spacer has a first portion adjacent a first sidewall of the charge storage layer and on the substrate. The method further includes thinning the protective spacer. The method further includes, after the thinning the protective spacer, forming a sidewall spacer over the protective spacer, wherein the sidewall spacer has a first portion on the substrate, and the first portion of the protective spacer is between the first sidewall of the control gate and the first portion of the sidewall spacer. The method may have a further characterization by which forming the protective spacer is formed such that a second portion of the protective spacer is adjacent a second sidewall of the control gate, wherein the second sidewall of the control gate is over the select gate. The method may have a further characterization by which forming the sidewall spacer is formed such that a second portion of the sidewall spacer is formed adjacent the second portion of the protective spacer. The method may have a further characterization by which forming the protective spacer is formed such that a third portion of the protective spacer is adjacent a second sidewall of the select gate, wherein the first sidewall of the select gate is between the second sidewall of the select gate and the first sidewall of the control gate. The method may have a further characterization by which forming the sidewall spacer is formed such that a third portion of the sidewall spacer is formed adjacent the third portion of the protective spacer. The method may have a further characterization by which forming the protective spacer is formed such that a second portion of the protective spacer is adjacent a second sidewall of the control gate, wherein the second sidewall of the control gate is over the select gate, and a third portion of the protective spacer is adjacent a second sidewall of the select gate, wherein the first sidewall of the select gate is between the second sidewall of the select gate and the first sidewall of the control gate. The method may further include forming source/drain regions in the substrate adjacent the select gate and the control gate, such that the select gate and control gate are between the source/drain regions. The method may have a further characterization by which the protective spacer comprises an oxide and the sidewall spacer comprises at least one of an oxide or a nitride. The method may further include forming logic gates for logic devices, wherein the protective spacer is formed prior to the forming the logic gates. The method may have a further characterization by which the thinning of the protective spacer occurs during the forming the logic gates. The method may have a further characterization by which the charge storage layer comprises nanocrystals surrounded by a dielectric.

Also disclosed is a method for forming a semiconductor device including forming a select gate over a substrate. The method may further include forming a charge storage layer and a control gate over the select gate, wherein the charge storage layer and control gate overlap a first sidewall of the select gate and the charge storage layer is between the select gate and the control gate. The method may further include forming a protective spacer adjacent the charge storage layer, the control gate, and a second sidewall of the select gate, wherein the protective spacer adjacent a first sidewall of the charge storage layer is on the substrate. The method may further include forming logic gates for logic devices. The method may further include during the forming the logic gates, thinning the protective spacer. The method may further include forming a sidewall spacer over the protective spacer, wherein the protective spacer is between the sidewall spacer and the control gate and between the sidewall spacer and the first sidewall of the select gate. The method may have a further characterization by which the forming the sidewall spacer over the protective spacer comprises forming the sidewall spacer adjacent to sidewalls of the logic gates. The method may have a further characterization by which the sidewall spacer is immediately adjacent to the sidewalls of the logic gate. The method may have a further characterization by which, during the forming the logic gates, the thinning of the protective spacer occurs as a result of ashing or cleaning. The method may further include forming source/drain regions in the substrate adjacent the select gate and the control gate, such that the select gate and control gate are between the source/drain regions. The method may have a further characterization by which forming source/drain regions further comprises forming source/drain regions adjacent the logic gates. The method may have a further characterization by which the protective spacer comprises an oxide. The method may have a further characterization by which the sidewall spacer comprises at least one of an oxide or a nitride. The method may have a further characterization by which the charge storage layer comprises nanocrystals surrounded by a dielectric.

Although the invention is described herein with reference to specific embodiments, various modifications and changes can be made without departing from the scope of the present invention as set forth in the claims below. For example, other combinations of materials for the various purposes of conductivity, dielectric properties, and protection. For example, metal gates and other types of charge storage layers may be found to be effective. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor device, comprising:
   forming a select gate over a substrate;
   forming a charge storage layer and a control gate over the select gate, wherein the charge storage layer and control gate overlap a first sidewall of the select gate and the charge storage layer is between the select gate and the control gate;
   forming a protective spacer, wherein the protective spacer has a first portion adjacent a first sidewall of the charge storage layer and on the substrate;
   thinning the protective spacer;
   forming logic gates for logic devices, wherein the thinning of the protective spacer occurs during the forming the logic gates; and
   after the thinning the protective spacer, forming a sidewall spacer over the protective spacer, wherein the sidewall spacer has a first portion on the substrate, and the first portion of the protective spacer is between the first sidewall of the control gate and the first portion of the sidewall spacer.

2. The method of claim 1, wherein the forming the protective spacer is formed such that a second portion of the protective spacer is adjacent a second sidewall of the control gate, wherein the second sidewall of the control gate is over the select gate.

3. The method of claim 2, wherein the forming the sidewall spacer is formed such that a second portion of the sidewall spacer is formed adjacent the second portion of the protective spacer.

4. The method of claim 3, wherein the forming the protective spacer is formed such that a third portion of the protective spacer is adjacent a second sidewall of the select gate, wherein the first sidewall of the select gate is between the second sidewall of the select gate and the first sidewall of the control gate.

5. The method of claim 4, wherein the forming the sidewall spacer is formed such that a third portion of the sidewall spacer is formed adjacent the third portion of the protective spacer.

6. The method of claim 2, wherein the forming the protective spacer is formed such that a second portion of the protective spacer is adjacent a second sidewall of the control gate, wherein the second sidewall of the control gate is over the select gate, and a third portion of the protective spacer is adjacent a second sidewall of the select gate, wherein the first sidewall of the select gate is between the second sidewall of the select gate and the first sidewall of the control gate.

7. The method of claim 1, further comprising forming source/drain regions in the substrate adjacent the select gate and the control gate, such that the select gate and control gate are between the source/drain regions.

8. The method of claim 1, wherein the protective spacer comprises an oxide and the sidewall spacer comprises at least one of an oxide or a nitride.

9. The method of claim 1,
   wherein the protective spacer is formed prior to the forming the logic gates.

10. The method of claim 1, wherein during the forming the logic gates, the thinning of the protective spacer occurs as a result of ashing or cleaning.

11. The method of claim 1, wherein the charge storage layer comprises nanocrystals surrounded by a dielectric.

12. A method for forming a semiconductor device, comprising:
    forming a select gate over a substrate;
    forming a charge storage layer and a control gate over the select gate, wherein the charge storage layer and control gate overlap a first sidewall of the select gate and the charge storage layer is between the select gate and the control gate;
    forming a protective spacer adjacent the charge storage layer, the control gate, and a second sidewall of the select gate, wherein the protective spacer adjacent a first sidewall of the charge storage layer is on the substrate;
    forming logic gates for logic devices;
    during the forming the logic gates, thinning the protective spacer; and
    forming a sidewall spacer over the protective spacer, wherein the protective spacer is between the sidewall spacer and the control gate and between the sidewall spacer and the first sidewall of the select gate.

13. The method of claim 12, wherein the forming the sidewall spacer over the protective spacer comprises forming the sidewall spacer adjacent to sidewalls of the logic gates.

14. The method of claim 13, wherein the sidewall spacer is immediately adjacent to the sidewalls of the logic gate.

15. The method of claim 12, wherein during the forming the logic gates, the thinning of the protective spacer occurs as a result of ashing or cleaning.

16. The method of claim 12, further comprising forming source/drain regions in the substrate adjacent the select gate and the control gate, such that the select gate and control gate are between the source/drain regions.

17. The method of claim 16, wherein forming source/drain regions further comprises forming source/drain regions adjacent the logic gates.

18. The method of claim 12, wherein the protective spacer comprises an oxide.

19. The method of claim 18, wherein the sidewall spacer comprises at least one of an oxide or a nitride.

20. The method of claim 12, wherein the charge storage layer comprises nanocrystals surrounded by a dielectric.

* * * * *